US008183512B2

(12) United States Patent
Mazumder et al.

(10) Patent No.: US 8,183,512 B2
(45) Date of Patent: May 22, 2012

(54) OPTICALLY-TRIGGERED POWER SYSTEM AND DEVICES

(75) Inventors: Sudip K. Mazumder, Chicago, IL (US); Tirthajyoti Sarkar, Chicago, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 452 days.

(21) Appl. No.: 11/922,185

(22) PCT Filed: Jun. 23, 2006

(86) PCT No.: PCT/US2006/024839
§ 371 (c)(1),
(2), (4) Date: Jan. 10, 2008

(87) PCT Pub. No.: WO2007/002603
PCT Pub. Date: Jan. 4, 2007

(65) Prior Publication Data
US 2009/0283664 A1    Nov. 19, 2009

Related U.S. Application Data

(60) Provisional application No. 60/694,048, filed on Jun. 24, 2005, provisional application No. 60/715,457, filed on Sep. 10, 2005, provisional application No. 60/796,910, filed on May 2, 2006.

(51) Int. Cl.
*H03K 17/78* (2006.01)
*H01J 40/14* (2006.01)
*H05B 37/02* (2006.01)

(52) U.S. Cl. .............. 250/214 SW; 250/214 R; 315/159

(58) Field of Classification Search ........... 250/214 SW, 250/214 LS, 214.1, 214 A, 214 LA, 214 AL, 250/214 C, 214 AG, 227.14; 257/80, 86, 257/184, 434; 327/427; 315/159; 398/58, 398/135, 168, 202, 208; 348/223.1, 272, 348/231.9
See application file for complete search history.

(56) References Cited

U.S. PATENT DOCUMENTS 4,626,884 A    12/1986  Shannon
4,719,551 A *  1/1988   Nishizawa et al. ............. 363/41
(Continued)

FOREIGN PATENT DOCUMENTS
WO    WO 2007/002603    1/2007

OTHER PUBLICATIONS

Buttram, M., "Some Future Directions for Repetitive Pulsed Power", *Science*, vol. 1, 2001, pp. 3-8.

(Continued)

*Primary Examiner* — Georgia Y Epps
*Assistant Examiner* — Don Williams
(74) *Attorney, Agent, or Firm* — Greer, Burns & Crain Ltd.

(57) ABSTRACT

A power device is provided in an optically-triggered power system having a controller for generating electrical control signals and a converter for converting the electrical control signals to optical control signals. The power device includes a pair of terminals and a P-body region provided adjacent an $N^+$ source region. An optical window is provided at least partially over the P-body region, and an $N^-$ drift region is provided between the two terminals. The P-body region causes current to conduct between the first and second terminal through the $N^-$ drift region when an optical control signal is incident on the optical window.

27 Claims, 8 Drawing Sheets

U.S. PATENT DOCUMENTS

| | | | |
|---|---|---|---|
| 4,829,512 A * | 5/1989 | Nakai et al. | 370/224 |
| 4,835,409 A | 5/1989 | Bhagwat et al. | |
| 5,214,275 A | 5/1993 | Freeman et al. | |
| 5,237,633 A | 8/1993 | Gaw et al. | |
| 5,270,251 A | 12/1993 | Cohen et al. | |
| 5,444,729 A | 8/1995 | Chung | |
| 5,450,430 A | 9/1995 | Chung et al. | |
| 5,535,001 A | 7/1996 | Tajima | |
| 5,550,939 A | 8/1996 | Rodgers | |
| 5,554,882 A | 9/1996 | Falk | |
| 5,596,522 A | 1/1997 | Ovshinsky | |
| 5,663,580 A | 9/1997 | Harris et al. | |
| 5,754,714 A | 5/1998 | Suzuki | |
| 6,034,576 A * | 3/2000 | Kuth | 333/101 |
| 6,054,724 A * | 4/2000 | Ogihara et al. | 257/88 |
| 6,111,271 A * | 8/2000 | Snyman et al. | 257/80 |
| 6,154,477 A | 11/2000 | Weidenheimer | |
| 6,218,682 B1 | 4/2001 | Zucker et al. | |
| 6,541,752 B2 | 4/2003 | Zappa et al. | |
| 6,681,079 B1 | 1/2004 | Maroney | |
| 7,227,280 B2 | 6/2007 | Zucker et al. | |

OTHER PUBLICATIONS

Chang, S.J. et. al., "400nm InGaN and InGaN/AlGaN multiquantam well light-emitting diodes", *IEEE*, 2003, pp. 91-94.

Davydov, V.Y. et. al., "Absorption and Emission of Hexagonal InN. Evidence of Narrow Fundamental Band Gap", *Phys. Stat. Sol.* (b), vol. 229, No. 3, 2002, pp. R1-R3.

Davydov, V.Y. et. al., Band Gap of InN and In-Rich $In_xGa_{1-x}N$ alloys (0.36<x<1), *Phys. Stat. Sol.*, (b), vol. 230, No. 2, 2002, R4-R6.

Domen, K., "Lasing Mechanism of InGaN-GaN-AlGaN MQW Laser Diode Grown on SiC by Low-Pressure Metal-Organic Vapor Phase Epitaxy", *IEEE Journal of Selected Topics in Quantum Electronics*, vol. 4, No. 3, May/Jun. 1998, pp. 490-497.

Fischer, S. et. al., "Properties of GaN grown at high rates on sapphire and on 6H-SiC", *Appl. Phys. Lett.*, vol. 69, No. 18, Oct. 28, 1996, pp. 2716-2718.

Gradinaru, G. et. al., "A Review on the Breakdown Limitation of Photoconductive Semiconductor Power Switches", $9^{th}$ IEEE International Pulsed Power Conference, vol. 2, 1993, pp. 645-649.

Kipshidze, G. et. al., "High Quality AlN and GaN Grown on Compliant Si/SiC Substrates by Gas Source Molecular Beam Epitaxy", *Journal of Electronic Materials*, vol. 30, No. 7, 2001, pp. 825-828.

Mazzola, M.S. et. al., "Nanosecond optical quenching of photoconductivity in bulk GaAs switch", *Appl. Phys. Lett.*, vol. 55, No. 20, Nov. 13, 1989, pp. 2102-2104.

Mukai, T., "Recent Progress in Group-III Nitride Light-Emitting Diodes", *IEEE Journal on Selected Topics in Quantum Electronics*, vol. 8, No. 2, Mar./Apr. 2002, pp. 264-270.

Nakamura, S., "InGaN-Based Blue Laser Diodes", *IEEE Journal of Selected Topics in Quantum Electronics*, vol. 3, No. 3, Jun. 1997, pp. 712-718.

Neudeck, P. et. al., "High-Temperature Electronics-A Role for Wide Bandgap Semiconductors?", *Proceedings of the IEEE*, vol. 90, No. 6, Jun. 2002, pp. 1065-1076.

Peterkin, F.E. et. al., "Studies of Breakdown in Photoconductive GaAs Switches", *Conference Record of the $21^{st}$ International Power Modulator Symposium*, 1994, pp. 112-115.

Shi, W. et. al., "High Gain Lateral Semi-Insulating GaAs Photoconductive Switch Triggered by 1064 nm Laser Pulses", *Chin. Phys. Lett.*, vol. 19, No. 3 (2002) pp. 351-354.

Stout, D.C. et. al., "Investigation of a Laser-Controlled, Copper-Doped GaAs Closing and Opening Switch for Pulsed Power Applications", $8^{th}$ *IEEE Pulsed Power Conference*, 1991, pp. 41-44.

Wetzel, C. et. al., "GaN epitaxial layers grown on 6H-SiC by the sublimation sandwich technique", *Appl. Phys. Lett.*, vol. 65, No. 8, Aug. 22, 1994, pp. 1033-1035.

Zutavern, F. et. al., "Properties of High Gain GaAs Switches for Pulsed Power Applications", $11^{th}$ *IEEE International Pulsed Power Conference*, vol. 2, 1997, pp. 959-964.

U.S. Appl. No. 12/157,694, dated Jun. 11, 2008, Mazumder.

Phillip J. Stout and Mark J. Kushner, "Modeling of High Power Semiconductor Switches Operated in the Nonlinear Mode", *J. Appl. Phys.*, vol. 79, No. 4, Feb. 15, 1996, pp. 2084-2090.

Office Action dated Jan. 31, 2012 from U.S. Appl. No. 12/157,694, Jan. 31, 2012, Supid K. Mazumder.

\* cited by examiner

OPTICALLY-TRIGGERED POWER SYSTEM AND DEVICES

PRIORITY CLAIM

Applicants claim priority benefits under 35 U.S.C. §119 on the basis of U.S. provisional application No. 60/694,048, filed Jun. 24, 2005, and U.S. provisional application No. 60/715,457, filed Sep. 10, 2005, and U.S. provisional application No. 60/796,910, filed May 2, 2006.

STATEMENT OF GOVERNMENT INTEREST

This invention was made with Government assistance under Air Force Research Laboratory Grant No. FA8650-05-M-2553 and Office of Naval Research Grant No. N00014-06-1-0227. The Government has certain rights in this invention.

TECHNICAL FIELD

The invention relates to power electronics, and in particular to optically-triggered power devices for power electronic systems.

BACKGROUND ART

Next-generation photonic power electronic systems based on optically-triggered devices (OTDs) provide key advantages over conventional electrically-triggered devices (ETD) based switching power systems. First, optical switching enhances the possibility of system integration by reducing the problems associated with electromagnetic-interference (EMI) effects. Second, for two- and higher-level electrically-triggered (ET) switching converters, different designs of low- and high-side drivers are required; the latter is especially difficult to design for medium and high-power applications. For an optically-triggered (OT) converter, the designs of high- and low-side drivers remain the same yielding simple design, enhanced reliability, and monolithic integration. Third, unlike an OTD, as the switching frequency of an ETD increases, parasitic oscillations may be induced in the driver circuit owing to coupling effects between the device capacitance and the parasitic inductance of the gate connection and also due to transmission-line effects. Fourth, in an OTD, there is complete isolation between the gate driver and the power stage. As such, very high di/dt and dv/dt, which cause significant reliability problems in an ETD at a high switch frequency, have no impact on an OTD. Therefore, the basic architecture of the gate driver in an OTD is simple. Fifth, an OTD based converter does not suffer from gate-driver failure due to short-circuiting.

Additionally, recent research has shown that tangible reductions in weight, volume, and cost are possible through an application of emerging photonic technologies for vehicle power management systems, such as those based on fly-by-light (FBL) architecture. An electrically isolated flight control mode based on photonic technology could provide a lightweight, electromagnetic interference (EMI) resistant system.

However, to realize such photonic power electronics, device technologies need to be developed that address the following key issues: i) wavelength of operation; ii) electrical gain; iii) switching speed; and iv) high-temperature operability. Short wavelength (<400 nm) requirements, necessary for wide-band gap materials, are incompatible with fiber-optic distribution of control signals due to strong absorption and dispersion losses. To reduce the power requirements, volume, and weight of the optical triggering source, high electrical (device) gain and quantum efficiency is desirable. A fast turn-on and turn-off of the OTD along with low on resistance is needed to efficiently support high-frequency repetitive switching in power electronics. A low-loss rapid switching capability also enhances the power density of the power system, which is desirable for most applications. Finally, high-temperature operability is often required to address the robustness of the power converter and high power density.

The light-triggered thyristors and optothyristors are two known examples of photoconductive power devices designed for power electronics. However, both of these devices feature the inherent thyristor like latch-up problem leading to uncontrollable and slow turn-off which is not desirable for a fast repetitive switching device. Moreover, vertical devices like optothyristor employ a semi-insulating thick layer instead of controllably doped layer. This results in large voltage drop across the device during conduction. For switching devices in power electronic applications, this drop is unacceptable from the efficiency point of view and the voltage-sustaining layer must be doped controllably so as to maintain an optimum balance between on-state conduction drop and off-state voltage blocking capability.

DISCLOSURE OF INVENTION

The present invention is directed to optically-triggered power systems and devices. The optically-triggered power system in accordance with one embodiment of the present invention includes a controller for generating electrical control signals, a converter for converting the electrical control signals to optical control signals and at least one power device being optically activated upon being exposed to a corresponding optical control signal from the converter.

The power device of the present invention includes a pair of terminals and a P-body region provided adjacent an $N^+$ source region. An optical window is provided at least partially over the P-body region, and an $N^-$ drift region is provided between the two terminals. The P-body region causes current to conduct between the first and second terminal through the $N^-$ drift region when the optical control signal is incident on the optical window.

BEST MODE FOR CARRYING OUT THE INVENTION

The invention is directed to photogeneration (generation of electron-hole pairs by shining light of suitable wavelength on a semiconductor) and recombination mechanism to trigger a power semiconductor device from off-state to on-state and vice versa without any electrical signal applied to its controlling gate terminal. This precludes the need to have an electrical gate terminal. As the photogeneration is an instantaneous process, an almost zero delay between the shining of light and initiation of device turn-on is resulted. The turn-off speed is primarily governed by the recombination lifetime of the photogenerated carriers.

Using primary device materials of very short lifetime such as GaAs, fast repetitive switching capability by reducing both turn-on and turn-off time is achieved. The advantages over the existing technology have been made possible by integrating optically active nature of a III-V compound semiconductor, e.g., GaAs, to P-N junction based power device structure and thus triggering a switching power semiconductor device through direct optical control using one or multiple optical source of monochromatic wavelength.

Figure 1:
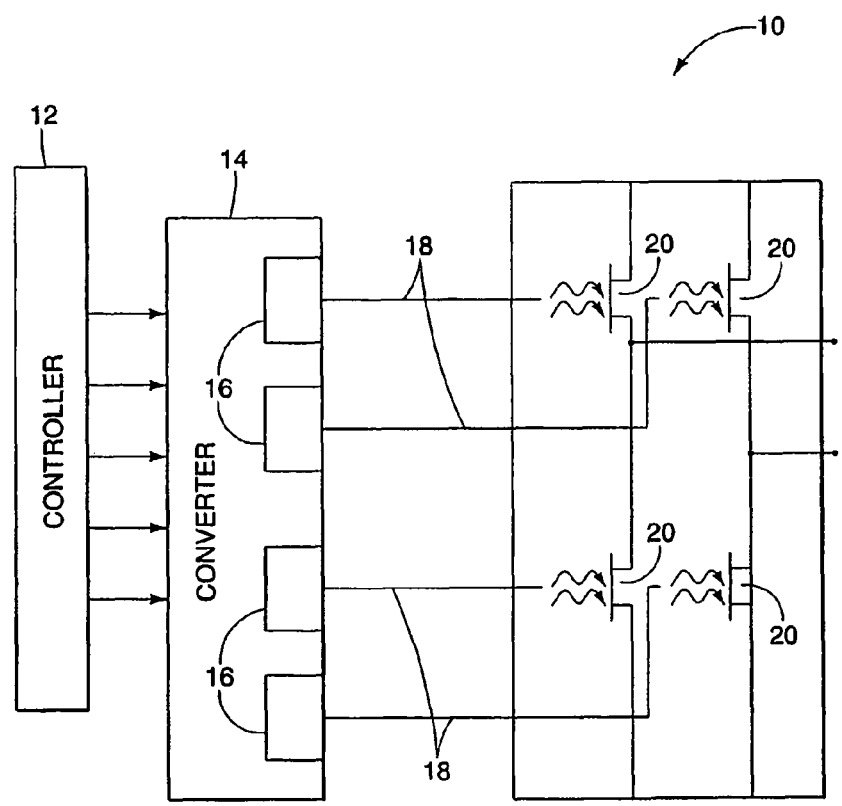
FIG. 1 is a block diagram of a direct optically-triggered power electronic system in accordance with one embodiment of the present invention.

Turning now to FIG. 1, a direct optically-triggered power electronic system 10 in accordance with one embodiment of the present invention includes a controller 12 for outputting electrical control signals. A converter 14 receives the electrical control signals from the controller 12 and converts them into optical signals, i.e., light signals. The converter 14 includes a number of laser drivers 16 for generating the optical signals having the same or different wave lengths and same or different intensities. The optical signals from the converter 14 are then carried by optical waveguides 18 such as optical fibers 18 to optically-triggered power devices 20 which operate or trigger when the optical signals are received.

In the preferred embodiment, the controller 12 is an electronic circuit which generates suitable timing signals for controlling the turn-on and turn-off of the power devices 20 in the power electronics system 10. It receives information on the electrical state of the power electronics system (e.g. voltage at different nodes, current through different branches of the circuit) through suitable sensors and processes that information to generate those control signals.

The converter 14 may be a semiconductor laser diode which accepts input electrical current signals and generate output light pulses accordingly. It may also be a light-emitting diode. It may also be a multi-stage device, for example, a solid-state laser system pumped by a laser diode. In this case, the laser diode accepts the input electrical signals, converts them to optical signals, which is fed to the solid-state laser. Solid-state laser then generates the final output optical signals. Nevertheless, the overall device takes input electrical signals and generates output optical signals following the input signals Referring to FIGS. 2 and 3, the optically-triggered power devices 20 and 21 includes two electrical terminals 23, 25 attached respectively to a source region 22 and a drain region 24, and an optical window 26. The power devices 20 also include epitaxial layers of a P-type layer 28 of AlGaAs, an N-type layer 30 of GaAs and an N—AlGaAs surface barrier layer 32 (in the optical window 26) from the bottom respectively grown on top of semi-insulating GaAs substrate 34 (shown in FIG. 3).

GaAs was chosen as the primary device material because of its direct bandgap nature, higher mobility, and fast photogeneration-recombination dynamics. The doping and thickness values of these layers have been chosen such as to realize the superjunction charge-balance, i.e., the total positive charge contributed by P-type layer 28 nullifies the total negative charge contributed by the N-type layers 30 on top of it. This ensures complete depletion of a drift region 36 formed by the GaAs N-type layer 30, and makes the breakdown voltage of the power devices 20, 21 linearly dependent on the drift length $L_{drift}$. In the blocking or open state, the applied voltage is supported by the reverse biased P-N junction between a P-body region 40 and the N-drift 36 region.

The source and the drain regions 22, 24 below the terminals 23, 25 are highly-doped areas. For the power device 20 such as an optically-triggered power transistor (OTPT) (FIG. 2), both are $N^+$-type, and for the power device 21 such as an optically-gated bipolar transistor (OGBT) (FIG. 3), the source region 22 is an $N^+$-type and the drain region 24 is a $P^+$-type. These regions 22, 24 inject the carriers (electron and holes) into their respective power devices 20, 21 from the circuit (not shown) through the electrical contacts, i.e., the terminals 23, 25.

Figure 2:
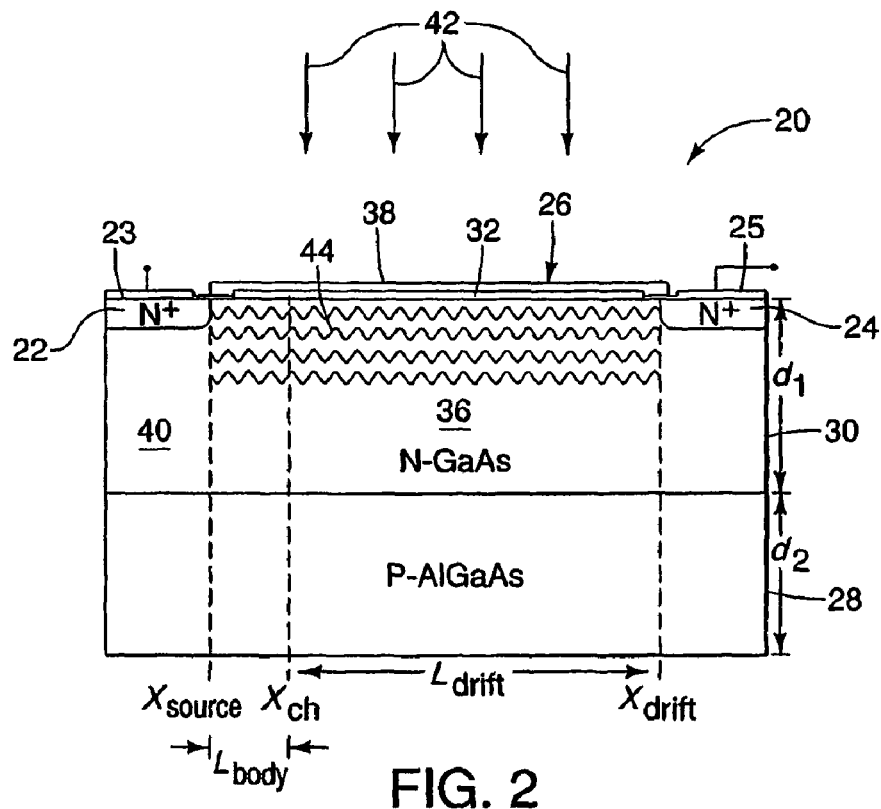
FIG. 2 is an optically-triggered power device in accordance with one embodiment of the present invention.

The optical window 26, in the embodiment shown in FIG. 2, includes an anti-reflecting layer 38 between the electrodes, preferably made of suitable dielectric material, such as SiN, of particular thickness, e.g., approximately 100 nm thick, that result in minimum amount of reflection of light. The diffused P-body region 40 of the power device 20 is realized by a zinc diffusion method, and creates an almost parallel-plate like junction with the N-drift 36 region. The thin AlGaAs surface barrier layer 32 is used to suppress Fermi-pinning effects and surface recombination velocity effects which may degrade the overall device performance, lowering the optical triggering efficiency. The AlGaAs surface barrier layer 32, being transparent to the operating wavelength of the optical signals, does not cause photogeneration.

When triggering light 42 shines on the optical window 26, the conduction starts by photogeneration in the P-body region 40. For the power device 20 such as the OTPT shown in FIG. 2, the optical window 26 spreads over the drift length $L_{drift}$ between the drain and source regions 24, 22, and photogenerated carriers electrically connects the terminals 21 and 23 via a conducting channel 44. When the triggering light 42 shuts off, photogenerated carriers recombine and the channel 44 ceases to turn the power device 20 off.

Figure 3:
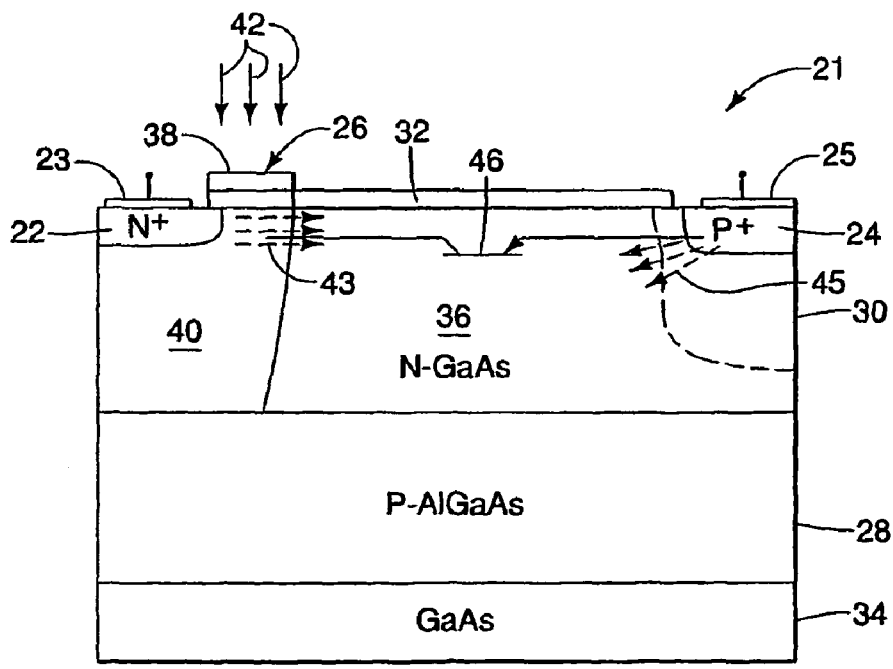
FIG. 3 is an optically-triggered power device in accordance with another embodiment of the present invention.

For the power device 21 such the OGBT shown in FIG. 3, the optical window 26 only covers the region around the P-body region 40 and photogenerated electrons 43 act as the base current for the lateral P-N-P transistor 46 to turn the device on. The forward biased P-N junction on the drain region 24 side of the power device 20 injects holes 45 into the drift region 36 that modulates its conductivity and start current conduction, i.e., the holes 45 starts a process called "optically-initiated conductivity modulation." When the light shuts off, the base current to the P-N-P transistor ceases due to recombination and the power device 40 turns off.

This additional carrier injection by the P-N-P transistor 46 helps to achieve gain for the OGBT type power device 21. The optical window 26 needs to cover only the P-body region 40 to create a photogenerated channel to supply electrons. This is unlike the OTPT type power device 20 where direct photogenerated carriers help to build the device current without any additional electrical gain. This makes OTPT turn-on very fast, limited only by laser driver 16 (shown in FIG. 1) trigger rise time. For the OGBT type power device 21, the hole injection from the $P^+$ drain region 24 build up the primary device current but that introduces a delay and the turn-on becomes slower. Turn-off for both the devices is limited by the recombination lifetime which is around approximately 1-10 ns for moderately doped GaAs.

Figure 4:
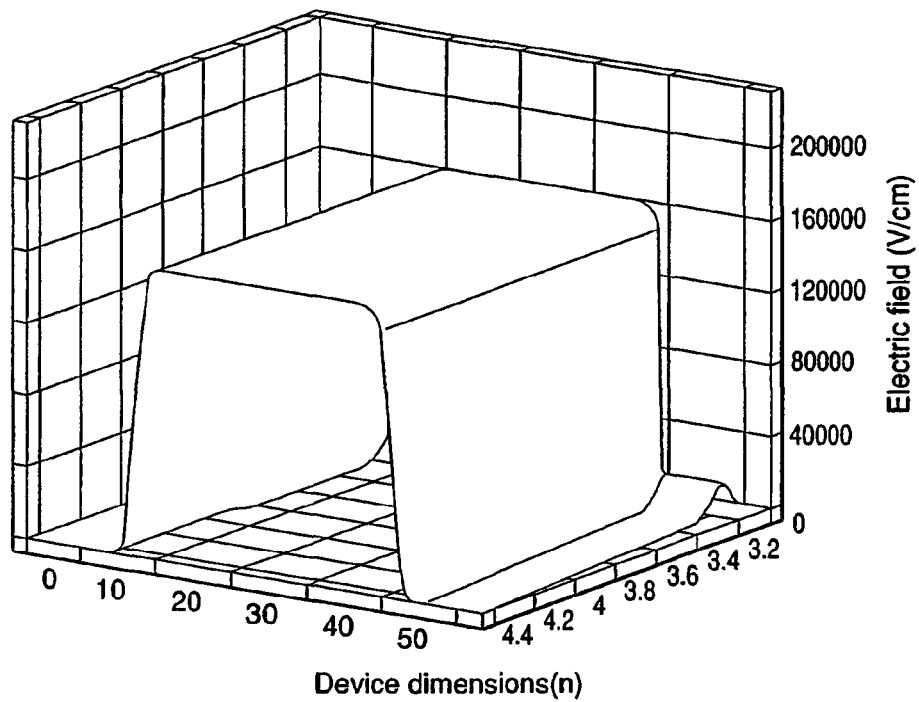
FIG. 4 is a diagram showing the two-dimensional electric field distribution inside an optically-triggered power device at the instant of breakdown.
Figure 5:
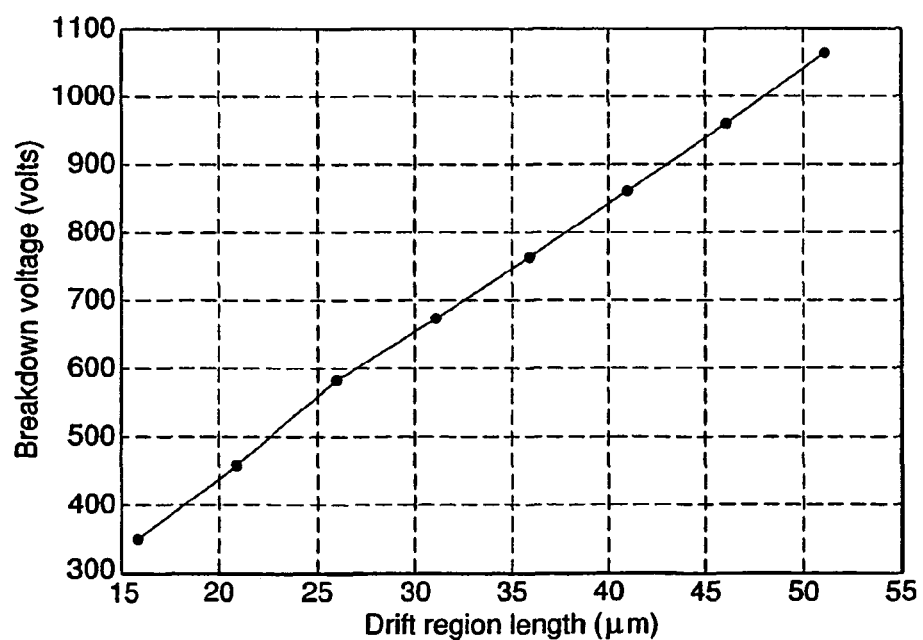
FIG. 5 is a chart showing the linear dependents of the blocking voltage with the length of a drift region when super junction charge-balance is condition is satisfied.

FIG. 4 shows the two-dimensional electric field distribution inside the OTPT power device 21 at the instant of breakdown, while FIG. 5 demonstrates the linear dependence of the blocking voltage with the length of the drift region $L_{drift}$ when superjunction charge-balance condition is satisfied by proper device design. The breakdown electric field is shown to be approximately 200-250 kV/cm. The flatness of the field in the entire drift region $L_{drift}$ indicates complete depletion of this region by charge-balance.

Figure 6:
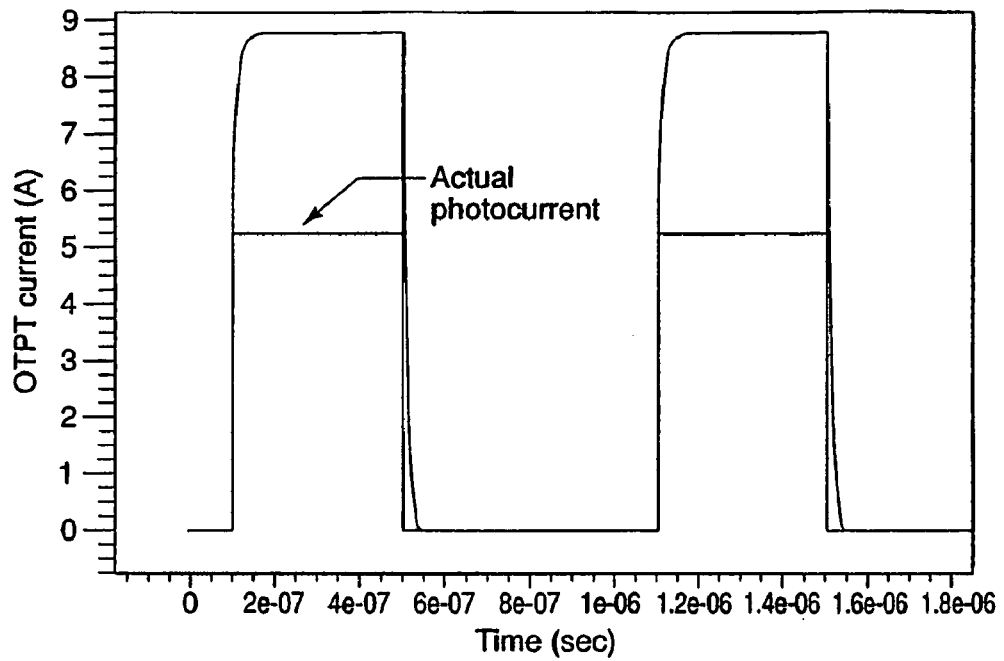
FIGS. 6 and 7 are charts showing the switching results of the optically triggered power devices of the present invention.
Figure 7:
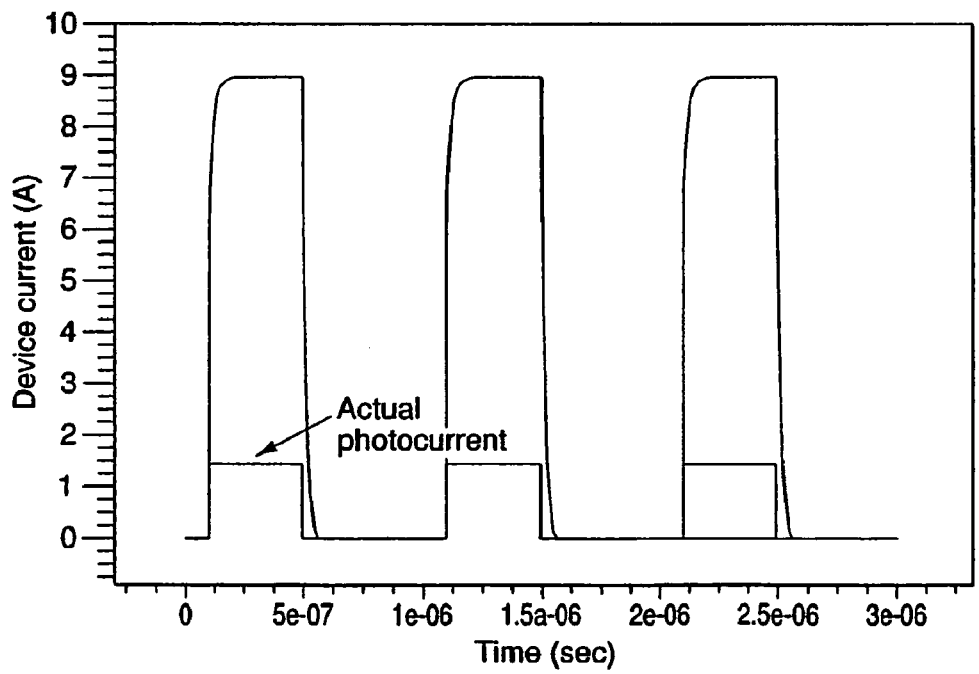

FIGS. 6 and 7 show the switching results (with a triggering wavelength of 808 nm) for the OTPT and OGBT type power devices 20, 21. They shows that both of these devices are "latch-free" device i.e., turning off the triggering light source ensures turn-off of the device. While for the OTPT power device 20 the current gain is slightly higher than 1, the OGBT power device 21 exhibits higher gain but at the price of slower turn-on compared to OTPT.

Superjunction charge-balance in the OTPT type power device 20, for example, ensures flat electric field in the completely depleted drift region 36 (see FIG. 4) at the instant of breakdown. This enhances the breakdown voltage for same active device area and thus keeps specific on-state resistance low. Following charge-balance condition needs to be satisfied for the highest breakdown voltage, $$d_1 N_1 + d_{cap} N_{cap} = d_2 N_2 \quad (1)$$

If the superjunction condition is satisfied by controlling the thickness and doping density of the epitaxial layers, then the breakdown voltage becomes almost independent of GaAs layer doping. Also the breakdown voltage becomes a linear function of the length of the drift region 36 (FIG. 5) and can be extended indefinitely by increasing the drift length. Deviation from the optimum condition, however, may result in a decrease in the breakdown voltage. Sensitivity studies show that the decrease in breakdown voltage varies with the percentage charge-imbalance. Positive (negative) imbalance denotes more P (N)-type charge than N (P)-type charge.

For commercial vertical power MOSFETs, the relation between $V_{Br}$ and $R_{on,sp}$, i.e., the "silicon limit", is given by $$R_{on,sp} \propto V_{Br}^{2.5} \quad (2)$$

For OTPT, for example, physics-based analyses yield two transcendental equations, which couple $V_{Br}$ and $R_{on,sp}$ through the common quantity $L_{drift}$. They are as follows:

$$\int_0^{L_{drift}} \left[ \begin{array}{l} 2.994 \times 10^5 \exp(-(6.648 \times 10^5 L_{drift} / V_{Br})^{1.6}) + \\ 2.215 \times 10^5 \exp(-(6.57 \times 10^5 L_{drift} / V_{Br})^{1.75}) \end{array} \right] dx = 1 \quad (3)$$

$$R_{on,sp} = (L_{drift} + L_{body} + 2 \quad (4)$$

$$L_{electrode}) \left[ \frac{\left[\left(\left(\frac{1}{D_a \tau_a} + \frac{C_d N_{body}}{D_a}\right)\sqrt{\left(\frac{\mu_a}{D_a}E\right)^2 + 4\left(\frac{1}{D_a \tau_a} + \frac{C_d N_{body}}{D_a}\right)}\right)\right] (L_{body} + L_{drift})}{2 \int_0^{d_1} q[G_n(y) + C_d n_i^2](K_1 m_2 - K_2 m_1)\mu_a dy} \right]$$

Equation (3) is obtained from the avalanche breakdown condition and GaAs impact ionization model. Equation (4) is obtained by the solution of one-dimensional charge-continuity equation. The common coupling term is $L_{drift}$. In equation (4), $K_1$ and $K_2$ are constants which depend on doping density boundary conditions and m1 and m2 are given by $$m_1, m_2 = \frac{-\left(\frac{\mu_a}{D_a}E\right) \pm \sqrt{\left(\frac{\mu_a}{D_a}E\right)^2 + 4\left(\frac{1 + \tau_a C_d N_{body}}{D_a \tau_a}\right)}}{2} \quad (5)$$

The photogeneration rate $G_n$ in equation (4) is given by $$G_n(y, t) = G_p(y, t) = \eta(1 - R)\frac{P(t)\lambda}{hc}\alpha e^{-\alpha y} \quad (6)$$

where h and c denote Planck's constant and velocity of light, respectively. Because of the coupling between equations (3) and (4) and dependence of $R_{on,sp}$ on $G_n$ (which is a function of P), the $R_{on}$ vs. $V_{Br}$ curve can be modulated with varying P. This modulation is unique to direct optically-controlled power devices like OTPT and has no analogue in ETDs. While equations (4) and (5) have been derived with respect to the OTPT type power device 20, it should be understood that these equations can be similarly derived for any lateral structure power devices including the OGBT type power device 21. The lateral structure as used herein is a power device structure in which current flows laterally between the two terminals 21 and 23, i.e., parallel to the junction formed between the P-type GaAs layer 28 and the N-type GaAs layer 30.

Figure 8:
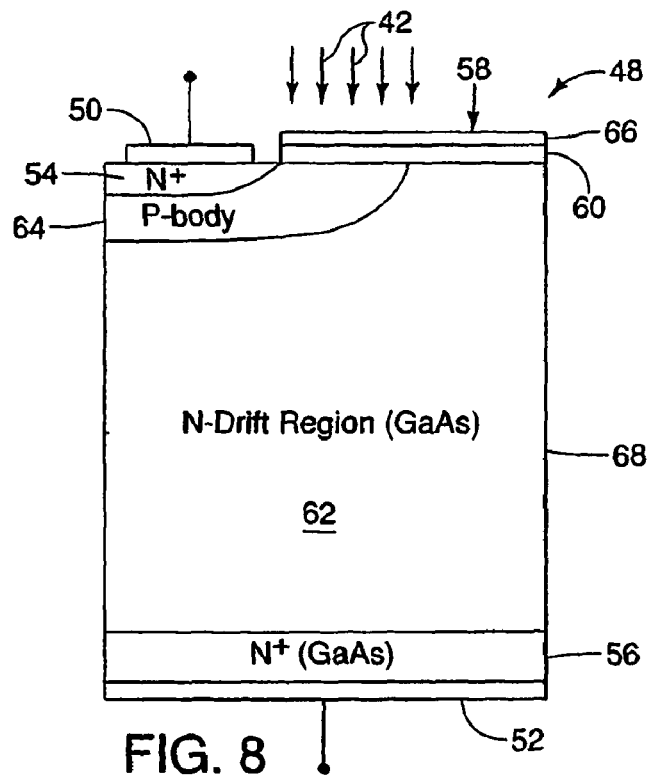
FIG. 8 is an optically-triggered power device in accordance with another embodiment of the present invention, having a vertical structure.

Turning now to FIG. 8, a power device 48 in accordance with another embodiment of the present invention includes two electrical terminals 50, 52 attached respectively to a source region 54 and a drain region 56, and an optical window 58. The power device 48 has a vertical structure in which current flows vertically between the two terminals, which are provided at the opposite sides of the power device, in contrast to power devices 20, 21 that have the terminals 23 and 25 on the same side.

As with the lateral structure power devices 20, 21, the optical window 58 also includes an N—AlGaAs surface barrier layer 60 provided substantially over an N-drift region 62 and a diffused P-body region 64. A an anti-reflecting layer 66, preferably of SiN and approximately 100 nm thick, is provided over the N—AlGaAs layer 60 to minimize reflection of light incident on the anti-reflecting layer 66. The thickness of the anti-reflecting layer 66 may change depending on the optical signal wavelength and the material of at least the surface barrier layer 60.

The N-drift region 62 is provided in an epitaxial layer of GaAs 68 extending from the N—AlGaAs surface barrier layer 60 of the optical window 58 to the drain region 56. The diffused P-body region 64 is provided between the source region 54 and the GaAs layer 68, and is realized by a zinc diffusion method. The N—AlGaAs surface barrier layer 60 is used to suppress Fermi-pinning effects and surface recombination velocity effects which may degrade the overall device performance, lowering the optical triggering efficiency. The surface barrier layer 60, being transparent to the operating wavelength of the opertical signals, does not cause photogeneration.

When triggering light 42 shines on the optical window 58, electron-hole pairs are created by photogeneration in the P-body region 64. Photogenerated electrons form a channel through the P-body region 64 and connect the source region 54 conductively to the drain region 56, thereby starting a current flow between the drain region and the source region through the N⁻ drift region 62. This places the power device 48 in an on-state. Majority of the photogenerated holes diffuse to the N⁺ source region 54 and get recombined with excess electrons there. Some carriers undergo surface recombination also. When the triggering light 42 is removed, the electrons in the P-body region 64 gets recombined rapidly with the excess holes in the P-body region. The channel ceases to exist in the P-body region 64 and the device goes back to the off-state.

The vertical structure power device 48, shown in FIG. 8, generally exhibits a higher gain, i.e. device current per unit photogenerated current compared to its lateral equivalent, shown in FIGS. 2 and 3. This is because the effective optical window area in the vertical structure is only $A_{opt}=ZL_{ch}$, where Z is the width of the device in the Z-dimension (along the line perpendicular to the plane of the paper) and $L_{ch}$ is the channel length. In the lateral structure, the window area is $A_{opt}=Z(L_{drift}+L_{ch})$, where $L_{drift}$ is the drift region length.

On the other hand, lateral structure offers parallel-plate like P-N junction, which is theoretically a good junction profile to support reverse bias, and ease of implementing superjunction (SJ) charge-balancing (by maintaining precise relation between the depth (d1, and d2) and doping densities (NI, and N2) of GaAs and AlGaAs layers by one-step epitaxial growth. This charge-balance ensures that the full drift region remains depleted regardless of its doping level and results in high breakdown voltage which is linearly dependent on drift region length but independent of drift doping density. The SJ structure has been demonstrated to help power device achieve higher breakdown voltage for same on-state resistance.

While the vertical structure power device 48 has been described with respect to GaAs as the primary material, other materials such as silicon carbide (SiC) and Indium Nitride (InN) may also be used in the vertical structure power devices. For example, the bandgap of $In_xGa_{1-x}N$ can be tailored to any value between 0.7 eV (that of pure InN) and 3.2 eV (that of pure GaN) by varying indium content. At x=0.55, the bandgap corresponding to 800-850 nm wavelength is obtained. For pure InN, 0.7-0.8 eV is obtained, which corresponds to approximately 1.55 μm wavelength, the primary niche of optical communication.

Figure 9:
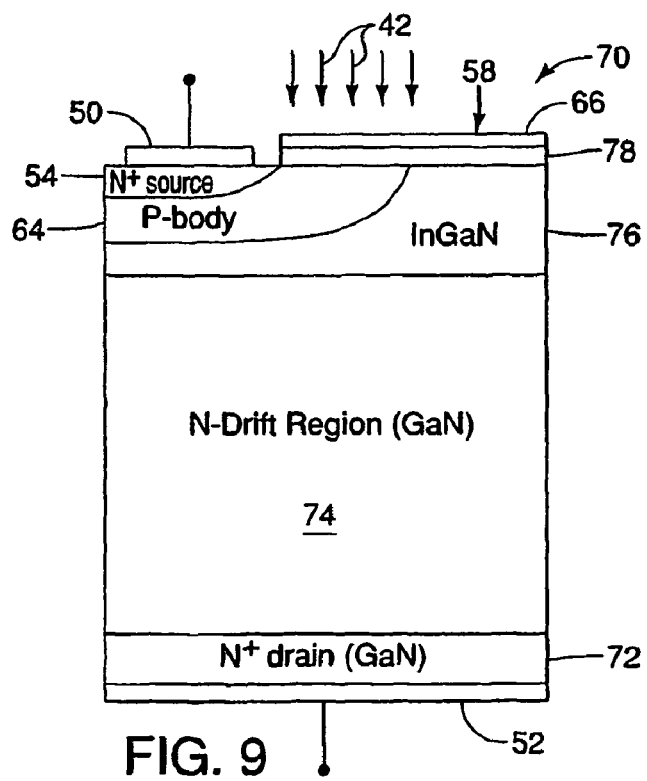
FIGS. 9-12 are alternate embodiments of the vertical structure power device of FIG. 8.

Examples of the vertical structure power devices having other primary materials are shown in FIGS. 9-12. The parts which are similar to those of the power device 48 are given the same reference numbers and are not described. FIG. 9 shows a vertical structure power device 70 that includes N⁺ drain region 72 and an N⁻ drift region 74 both formed of GaN. Alternatively, N⁺ drain region 72 may be replaced with a P⁺ drain region. The power device 70 also includes an InGaN optical absorption layer 76 provided between the drift region 74 and a GaN surface barrier layer 78, which is provided underneath the SiN anti-reflecting layer 66 of the optical window 58.

Figure 10:
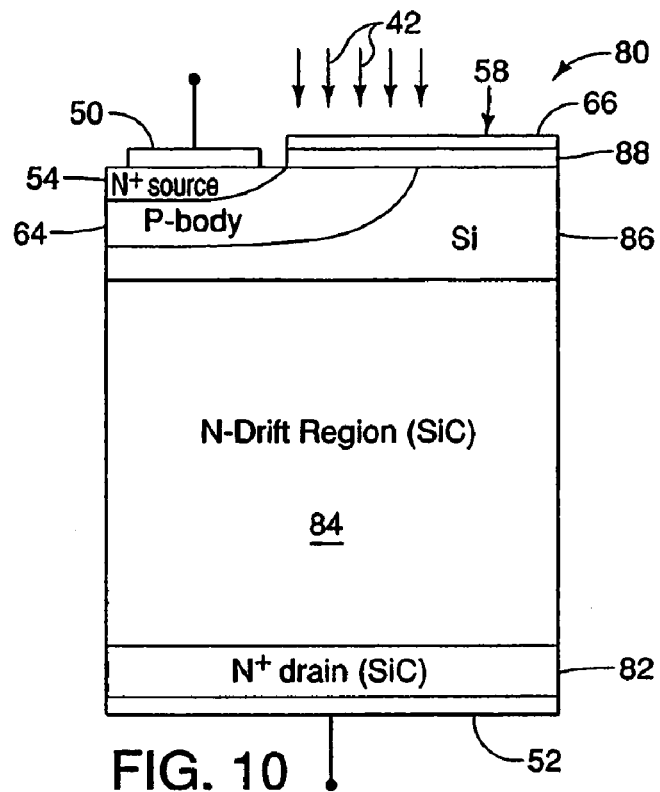

FIG. 10 shows a vertical structure power device 80 in accordance with another embodiment of the present invention. The power device 80 includes an N⁺ drain region 82 and an N⁻ drift region 84 both formed of SiC. Alternatively, the N⁺ drain region 82 may be replaced with a P⁺ drain region. The power device 80 also includes a Si optical absorption layer 86 provided between the drift region 84 and a SiC surface barrier layer 88, which is provided underneath the SiN anti-reflecting layer 66 of the optical window 58.

Figure 11:
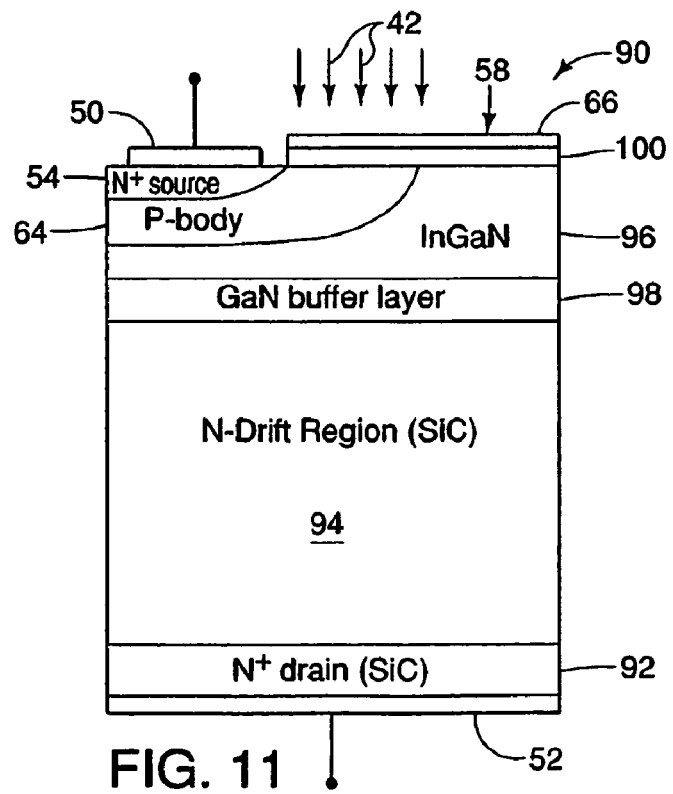

FIG. 11 shows a vertical structure power device 90 in accordance with yet another embodiment of the present invention. The power device 90 includes an N⁺ drain region 92 and an N⁻ drift region 94 both formed of SiC. Alternatively, the N⁺ drain region 92 may be replaced with a P⁺ drain region. The power device 90 also includes an InGaN optical absorption layer 96 provided between a GaN buffer layer 98 and a GaN surface barrier layer 100, which is provided underneath the SiN anti-reflecting layer 66 of the optical window 58. The buffer layer 98 is provided on top of the N⁻ drift region 94 and acts as a strain-relief layer between the SiC N⁻ drift region and the InGaN optical absorption layer 96. The lattice dimensional difference between SiC and InGaN is such that, if directly grown on top of one another, there may be mechanical strain in the interface which degrades device reliability and performance. GaN lattice dimension, being approximately a mid-value between the two, helps to minimize this strain.

In the power devices 70, 80, 82 shown in FIGS. 9-11, the optical absorption layers 76, 86, 96 are made of smaller bandgap material such as InGaN or Si, and the layer forming the N⁻ drift regions 74, 84, 94 made of wider bandgap material such as GaN or SiC. The purpose of the optical absorption layers 76, 86, 96 is to absorb optical signal of suitable wavelength (approximately 800-850 nm for Si or 1350-1550 nm for InGaN) which is transparent to the layer for the drift regions 74, 84, 94 (SiC or GaN). Therefore, the optical absorption layers 76, 86, 96 act as the optical triggering block whereas the drift region layers 74, 86, 94 act as voltage blocking layers. If the power devices 70, 80, 90 were made entirely of the material as in the drift regions 74, 84, 94, then a shorter wavelength would have been required because of the higher bandgap of such material. Shorter wavelength light is difficult to produce in a controllable manner and to transport efficiently over optical fiber. Thus, the optical absorption layers 76, 86, 96 facilitate the use of easily available longer wavelength light for triggering while maintaining the high voltage blocking capability of the power devices 70, 80, 90 by using wide bandgap material in the drift regions 74, 84, 94.

Figure 12:
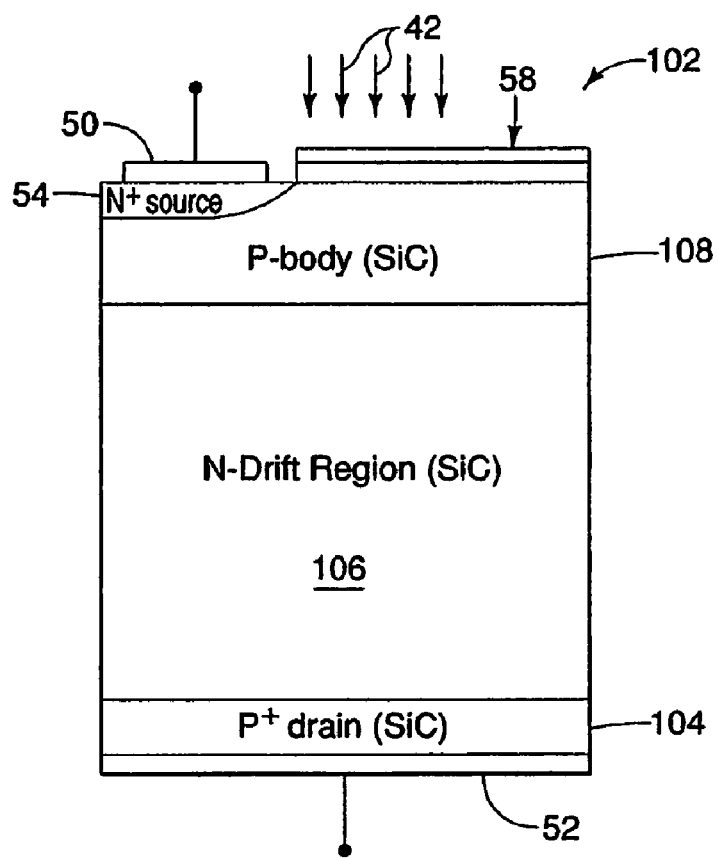

Turning now to FIG. 12, and in accordance with another embodiment of the present invention, a power device 102 has a vertical structure and includes an P⁺ drain region 104 and an N⁻ drift region 106 both formed of SiC. The power device 102 is further provided with a P-body region 108 which is also formed of SiC and extends the substantially the entire width of the power device 102.

The vertical structure optically-triggered power devices 48, 70, 80, 90, 102 described above may be implemented in an optically-triggered power transistor (OTPT) or an optically-gated bipolar transistor (OGBT).

Figure 13:
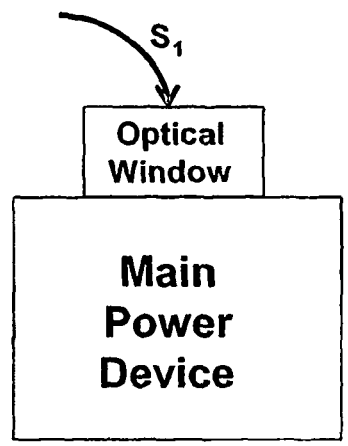
FIGS. 13-16 are additional embodiments of optically-triggered power devices of the invention.

Further embodiments of the present invention is now described. In one embodiment, shown in FIG. 13, the main power device (MPD) comprises only the main optically-triggered power device which receives an optical control signal through the optical window and is being controlled (both turn-on and turn-off) by this signal. Specific illustrations of device structures for this embodiment are shown in FIG. 2-11.

Figure 14:
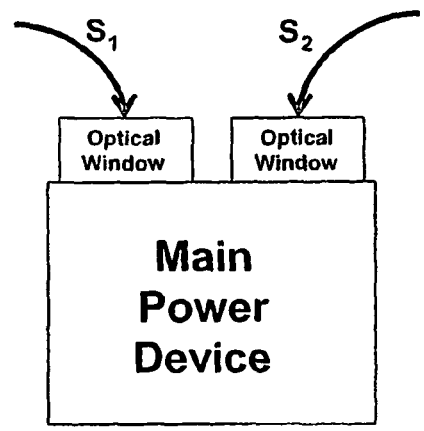

In the second embodiment, shown in FIG. 14, the MPD receives one optical control signal ($S_1$) for turn-on and turn-off (as same as the first embodiment) through a first optical window and a second optical signal ($S_2$) through another optical window. The second signal does not take part in actively controlling the device conduction state but is used to dynamically modulate its electrical performance parameters such as on-state resistance or turn-on and turn-off time. For example, the second light could be of different wavelength to excite certain trap-centers in the bandgap of the material, used to fabricate the device, which modulates the recombination lifetime of the material. This results in significant changes in the device optical gain, on-state resistance and switching speed (especially turn-off time). Another way, the second optical signal can modulate the potential barrier of a particular P-N junction present in the device structure to alter device on-state resistance or optical gain. The signals $S_1$ and $S_2$ can differ in intensity and/or wavelength.

Figure 15:
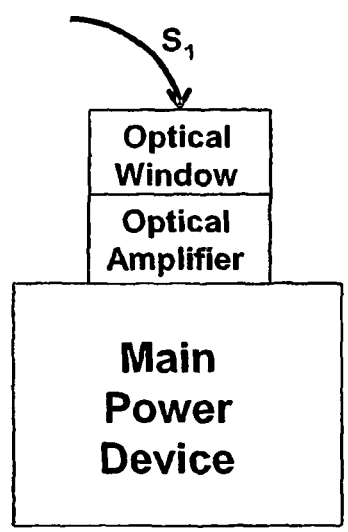

In the third embodiment (FIG. 15), the overall device comprises of, apart from the MPD, a secondary optical amplifier structure which is optically coupled to the main power device. The function of this amplifier is to receive a low-intensity optical signal and amplify it to feed to the main power device. This way, a low optical power source (LED or low-power laser) may be used to trigger the device thereby reducing the overall power electronic system cost and driver complexity.

Figure 16:
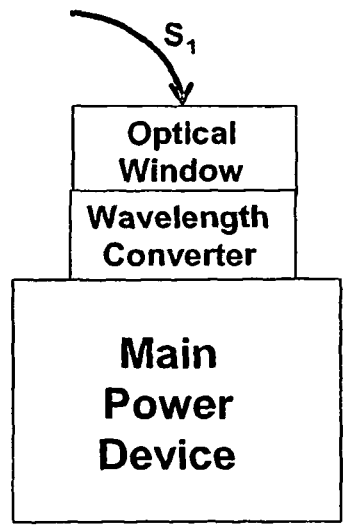

In the fourth embodiment (FIG. 16), the overall device comprises of, apart from the MPD, a secondary wavelength converter structure which is optically coupled to the main power device. The function of this amplifier is to receive an optical signal of a certain wavelength and convert it to an optical signal of different wavelength to feed to the main power device. This way, an optical source of industry-standard wavelength range (800-850 nm or 1350-1550 nm) can be used to directly control MPD made of wide bandgap device like SiC, GaN eliminating the need to have expensive and complex short wavelength (300-400 nm) optical sources.

This embodiment is different from the device structures shown in FIG. 9, FIG. 10, FIG. 11 etc. Those are device structure comprising wide bandgap material and a smaller bandgap material to enable the device to be triggered by a long wavelength signal. The device, due to the presence of smaller bandgap material, absorbs long wavelength light. But the fourth embodiment converts the incoming optical signal to a short wavelength and the MPD absorbs the short wavelength light.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. An optically-triggered power system, comprising:
a controller for generating electrical control signals;
a converter for converting the electrical control signals to optical control signals;
at least one power device having an optical window for receiving a corresponding optical control signal and enabling the optical control signal to directly create photogeneration of carriers in the power device to activate the power device.

2. The power system as defined in claim 1, wherein the converter includes at least one laser driver for generating the optical control signals.

3. The power system as defined in claim 2, wherein the optical control signals have different wavelength and/or different intensities.

4. The power system as defined in claim 2, wherein the optical control signals have same wavelength and/or same intensities.

5. The power system as defined in claim 1, wherein the optical signals are carried by optical waveguides, said waveguides comprising optical fibers.

6. The power system as defined in claim 1, wherein the power device conducts current therethrough when the power device is activated.

7. The power system as defined in claim 6, wherein the power device deactivates when the exposure of the optical control signal is removed from the power device.

8. A power device in an optically-triggered power system having a controller for generating electrical control signals and a converter for converting the electrical control signals to optical control signals, the power device comprising:
first and second terminals;
a P-body region provided adjacent an $N^+$ source region;
an optical window provided at least partially over the P-body region; and
an $N^{31}$ drift region provided between the first and second terminals;
wherein the P-body region causes current to conduct between the first and second terminal through the $N^-$ drift region when an optical control signal is incident on the optical window.

9. The power device as defined in claim 8, further comprising a P-type AlGaAs layer provided adjacent the $N^-$ drift region and the P-body region, wherein the $N^-$ drift region and the P-body region comprises GaAs.

10. The power device as defined in claim 9, wherein the first and second terminals are in electrical contact with the $N^+$ source region and an $N^+$ drain region, respectively, and the P-body region is adjacent the $N^+$ source region, and wherein the optical control signal received through the optical window creates photogeneration of carriers for conducting the current through a channel in the $N^-$ drift region.

11. The power device as defined in claim 9, wherein the first and second terminals are in electrical contact with the $N^+$ source region and an $N^+$ drain region, respectively, and the P-body region is adjacent the $N^+$ source region, and wherein the optical control signal received through the optical window creates photogeneration of carriers in the P-body region for initiating conductivity modulation of the $N^-$ drift region for conducting current between the first and second terminals.

12. The power device as defined in claim 9, further comprising a GaAs substrate provided adjacent the P-type AlGaAs layer on an opposite side from the $N^-$ drift region and the P-body region.

13. The power device as defined in claim 9, wherein the optical window comprises anti-reflecting layer and a transparent AlGaAs surface barrier layer adjacent the anti-reflecting layer.

14. The power device as defined in claim 9, wherein the power device comprises a lateral structure.

15. The power device as defined in claim 8, further comprising a drain region adjacent the $N^-$ drift region on an opposite side from the $N^+$ source region, wherein the drain region is an $N^+$ type or a $P^+$ type.

16. The power device as defined in claim 15, wherein the optical control signal received through the optical window creates photogenerated electrons in the P-body region to form a channel through the P-body region and connect the $N^+$ source region conductively to the drain region through the $N^-$ drift region.

17. The power device as defined in claim 16, wherein the power device comprises a vertical structure.

18. The power device as defined in claim 16 wherein the $N^-$ drift region comprises one of GaAs, GaN or SiC.

19. The power device as defined in claim 8, further comprising an optical absorption layer provided at least partially between the P-body region and the $N^-$ drift region.

20. The power device as defined in claim 19, wherein the optical absorption layer comprises InGaN or Si.

21. The power device as defined in claim 19, further comprising a buffer layer between the optical absorption layer and the $N^-$ drift region.

22. The device of claim 21, wherein said N-drift region extends between said source and said drain regions and said window extends between said terminal contacts.

23. The device of claim 21, wherein said P-body region separates the N-drift region from said source, said window is only over said P-body region, said source comprises a P-type source such that the device forms a P-N-P transistor and the photogenerated carriers provide base current to turn the transistor on.

24. The device of claim 21, wherein said P-body regions comprises zinc diffusion and that creates a parallel-plate like junction with said N-drift region.

25. A power device in an optically-triggered power system having a controller for generating electrical control signals and a converter for converting the electrical control signals to optical control signals, the power device comprising:

highly doped source and drain regions;
electrical terminal contacts to said source and drain regions;
an N-drift region interfaced to said drain region;
a P-body region interfaced with said N-drift region and said source;
a surface barrier layer on said N-drift region;
a window for accepting light to photogenerate carriers in said P-body region, the P-body and N-drift region being arranged relative said source and said drain to conduct electrical current in a channel established through said N-draft region between said source and drain only when light photogenerates carriers in said P-Body region.

26. The device of claim 25, wherein said P-body region and said N-drift region form a parallel-plate like junction.

27. The device of claim 26, wherein said P-Body region comprises a zinc diffusion.

* * * * *

UNITED STATES PATENT AND TRADEMARK OFFICE
CERTIFICATE OF CORRECTION

| | | |
|---|---|---|
| PATENT NO. | : 8,183,512 B2 | Page 1 of 1 |
| APPLICATION NO. | : 11/922185 | |
| DATED | : May 22, 2012 | |
| INVENTOR(S) | : Mazumder et al. | |

It is certified that error appears in the above-identified patent and that said Letters Patent is hereby corrected as shown below:

In the Specification:

Col. 3, line 35    After "received", please insert a --.--.

Col. 3, line 54    After "signals", please insert a --.--.

Col. 5, line 13    Please delete "shows" and insert --show-- therefor.

Col. 8, line 23    Please delete "86," and insert --84-- between "74," and "94".

In the Claims:

Col. 10, line 9    Please delete "$N^{31}$" and insert --$N^-$-- therefor.

Signed and Sealed this
Twenty-ninth Day of January, 2013

David J. Kappos
*Director of the United States Patent and Trademark Office*